(12) United States Patent
Yu et al.

(10) Patent No.: US 8,721,905 B2
(45) Date of Patent: May 13, 2014

(54) METHOD FOR FORMING MINUTE PATTERN AND METHOD FOR FORMING MINUTE PATTERN MASK

(75) Inventors: Se-Hwan Yu, Seoul (KR); Ji Seon Lee, Suwon-si (KR); Yoon Ho Khang, Yongin-si (KR); Kahp Yang Suh, Seoul (KR); Hyoung Sick Um, Seoul (KR); Jae Jun Chae, Seoul (KR); Sung Hun Lee, Seoul (KR)

(73) Assignees: Samsung Display Co., Ltd., Yongin, Gyeonggi-Do (KR); SNU R & DB Fountdation, Gwanak-Gu, Seoul (KR)

( * ) Notice: Subject to any disclaimer, the term of this patent is extended or adjusted under 35 U.S.C. 154(b) by 136 days.

(21) Appl. No.: 13/431,516

(22) Filed: Mar. 27, 2012

(65) Prior Publication Data

US 2013/0098869 A1 Apr. 25, 2013

(30) Foreign Application Priority Data

Oct. 20, 2011 (KR) .................. 10-2011-0107653

(51) Int. Cl.
*H01L 21/302* (2006.01)

(52) U.S. Cl.
USPC ............. 216/39; 216/41; 216/44; 216/49; 216/67; 430/313; 430/330; 438/94

(58) Field of Classification Search
None
See application file for complete search history.

(56) References Cited

U.S. PATENT DOCUMENTS

| | | | |
|---|---|---|---|
| 4,528,260 A * | 7/1985 | Kane | 430/321 |
| 6,387,808 B1 * | 5/2002 | Schiltz et al. | 438/689 |
| 6,486,058 B1 * | 11/2002 | Chun | 438/637 |
| 6,960,510 B2 * | 11/2005 | Deshpande et al. | 438/286 |
| 7,691,685 B2 | 4/2010 | Maekawa et al. | |
| 2005/0020051 A1 * | 1/2005 | Tsai | 438/613 |
| 2007/0155043 A1 * | 7/2007 | Hashimoto | 438/69 |
| 2009/0057700 A1 * | 3/2009 | Jin et al. | 257/98 |
| 2009/0203217 A1 * | 8/2009 | Lee et al. | 438/710 |
| 2010/0009295 A1 | 1/2010 | Um et al. | |
| 2010/0159404 A1 | 6/2010 | Hatakeyama et al. | |

(Continued)

FOREIGN PATENT DOCUMENTS

| KR | 10-0647513 B1 | 11/2006 |
|---|---|---|
| KR | 10-2010-0001813 A | 1/2010 |
| KR | 10-2010-0131377 A | 12/2010 |
| KR | 10-2012-0058072 A | 6/2012 |

OTHER PUBLICATIONS

English Abstract for Publication No. KR 10-1647513 B1.
English Abstract for Publication No. KR 10-2010-0131377 A.

(Continued)

*Primary Examiner* — Anita Alanko
(74) *Attorney, Agent, or Firm* — F. Chau & Associates, LLC

(57) ABSTRACT

A method for forming a minute pattern mask includes forming an etching target layer on a substrate. A convex pattern including a plurality of convex parts is formed on the etching target layer. A resin composition is coated on the convex pattern to form a resin layer including a first region neighboring the convex part and a second region positioned between the neighboring convex parts. The resin layer is ashed or etched to form the plurality of first resin patterns. The plurality of first resin patterns is processed to form a minute pattern mask including a plurality of second resin patterns. The etching target layer is etched using the plurality of second resin patterns as an etch mask to form a minute pattern.

21 Claims, 16 Drawing Sheets

(56) References Cited

U.S. PATENT DOCUMENTS

2010/0297552 A1 11/2010 Otsuka
2010/0308015 A1* 12/2010 Takano et al. .................. 216/37
2011/0033803 A1 2/2011 Hatakeyama et al.

OTHER PUBLICATIONS

English Abstract for Publication No. KR 10-2010-0001813 A.
English Abstract for Publication No. KR 10-2012-0057072 A.

* cited by examiner

METHOD FOR FORMING MINUTE PATTERN AND METHOD FOR FORMING MINUTE PATTERN MASK

CROSS-REFERENCE TO RELATED APPLICATION

This application claims priority to and the benefit of Korean Patent Application No. 10-2011-0107653 filed in the Korean Intellectual Property Office on Oct. 20, 2011, the entire contents of which are incorporated herein by reference.

TECHNICAL FIELD

Embodiments of the present invention relate to minute pattern masks. Particularly, exemplary embodiments of the present invention relate to a method of forming a minute pattern mask and forming a minute pattern using a minute pattern mask.

DISCUSSION OF THE RELATED ART

Manufacturing an electronic device such as a display device often involves the formation of fine and/or minute patterns. These fine and/or minute patterns may be used to create various wires and electrodes within the electronic devices.

A photolithography process may be used to form a pattern of the wires or the electrode. According to some photolithography processes, after coating a target layer, a photoresist layer (referred to as a photosensitive layer) is formed thereon, and an exposure mask (referred to as a photo-mask) is aligned thereon for exposure. The exposed photoresist layer is developed to form a photoresist layer pattern and the target layer is etched by using the photoresist layer pattern as an etching mask to form a pattern of a targeted electrode or wire.

The device used to expose the photoresist layer, the "light exposer," may be limited in how small a beam of light may be produced.

The patterns of wires and electrodes may also be formed using micro-contact printing (μ-CP), micro-transfer molding (μ-TM), micro-molding in capillaries (MIMIC) methods, solvent assisted micro-contact molding (SAMIM) methods helped by a solvent, etc.

SUMMARY

Exemplary embodiments of the present invention provide cost effective methods for forming minute patterns and for forming minute pattern masks that may be used in minute pattern formation.

A method for forming a minute pattern mask according to an exemplary embodiment of the present invention includes forming an etching target layer on a substrate. A convex pattern including a plurality of convex parts is formed on the etching target layer. A resin composition is formed on the convex pattern to form a resin layer including a first region neighboring a convex part of the plurality of convex parts and a second region positioned between two neighboring convex parts of the plurality of convex parts. Ashing or etching is performed on the resin layer to form a plurality of first resin patterns. The plurality of first resin patterns is processed to form a minute pattern mask including a plurality of second resin patterns. The etching target layer is etched using the plurality of second resin patterns as an etch mask to form a minute pattern.

The forming of the plurality of the second resin patterns may include heating the plurality of first resin patterns for reflowing.

A surface of a first resin pattern of the first resin patterns may have a first curved surface. A surface of a second resin pattern of the second resin patterns may have a second curved surface different from the first curved surface.

The second resin patterns may have a symmetrical cross-sectional shape.

The applying of the heat to the plurality of the first resin patterns for reflowing may be performed at a temperature in a range from substantially 150° C. to substantially 180° C.

The forming of the plurality of first resin patterns may include ashing or dry-etching using a gas.

The forming of the plurality of the first resin patterns may include removing the convex part.

In the forming of the plurality of first resin pattern, the resin layer and the convex part may be etched using a common etch process. An etch speed for the convex part may be greater than an etch speed for the resin layer.

In the forming of the plurality of first resin patterns, the resin layer may be ashed or etched after removing the convex part, though wet etching.

The first region of the resin layer may be thicker than the second region.

A thickness of the second region may be in a range from substantially 100 nm to substantially 600 nm.

The resin composition may include a polymer and a solvent.

The solvent may include isopropanol (IPA).

A concentration of the resin composition may be in a range from substantially 10% to substantially 50% by mass or volume.

The forming of the resin layer may include coating the resin composition on the convex pattern and then applying pressure to the resin composition.

The forming of the convex pattern may use a micro-contact printing method.

According to an exemplary embodiment of the present invention, the minute pattern mask and the minute pattern may be formed simply and in a cost-effective manner.

A method for forming a minute pattern includes forming an etching target layer. A convex pattern is formed on the etching target layer. A resin layer is formed by coating a resin composition on the convex pattern. The resin layer is ashed or etched. A minute pattern mask is formed by heating the ashed or etched resin layer to reflow the ashed or etched resin layer. The etching target layer is etched using the formed minute pattern mask.

DETAILED DESCRIPTION

Exemplary embodiments of the present invention will be described more fully hereinafter with reference to the accompanying drawings.

A method of forming a minute pattern mask and a method of forming a minute pattern according to an exemplary embodiment of the present invention will be described with reference to FIG. 1 to FIG. 17.

FIG. 1, FIG. 2, FIG. 3, FIG. 4, FIG. 5, FIG. 6, FIG. 7, FIG. 8, FIG. 9, FIG. 11, FIG. 14, FIG. 15, FIG. 16, FIG. 17, FIG. 18, FIG. 19, and FIG. 20 are cross-sectional views sequentially showing a formation method of a minute pattern according to an exemplary embodiment of the present invention. FIG. 10 is a graph illustrating a thickness of a resin layer according to a concentration of the resin layer in forming a minute pattern according to an exemplary embodiment of the present invention. FIG. 12 is a view showing an etch state according to a time of a convex pattern and a resin layer. FIG. 13 is a graph showing a change of an interval between the first patterns according to an ashing time in forming a minute pattern according to an exemplary embodiment of the present invention.

Figure 3:
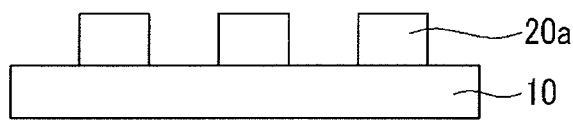
Figure 4:
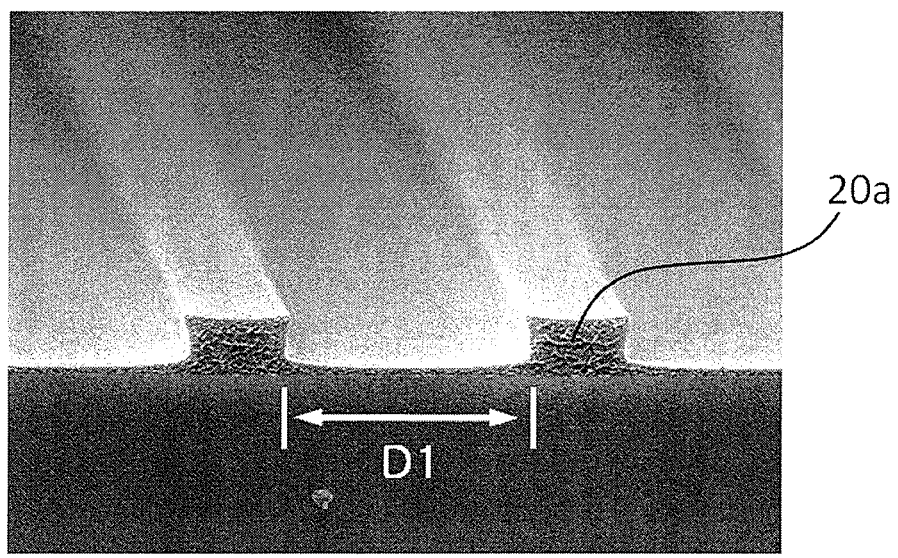

Referring to FIG. 3, an etching target layer 10, in which a pattern is to be formed, is formed on a substrate (not shown), and a convex pattern is formed thereon.

The etching target layer 10, according to an exemplary embodiment of the present invention, may include one or more of various materials such as a conductive material, a semiconductor material, and an insulating material. The composition of the etching layer 10 may be selected according to the material of the pattern to be formed.

The convex pattern has at least one convex part 20a. The convex pattern may include various polymers that can be removed by an ashing process such as an acryl-based resin, polystyrene (PS), polymethylmethacrylate (PMMA), a photo-hardening material, a thermosetting material, various inorganic materials that are capable of being removed by a dry etch process such as a silicon-based material of SiOC, SiNx, and SiOx, a material that is capable of being removed by a wet etch process such as a metal or alloys of Cu and Al. The convex pattern may further include a solvent dissolving one or more of the above materials. Examples of the solvent may include ethers, saturated hydrocarbons, unsaturated hydrocarbons, ketones, and aromatic hydrocarbons including toluene. However, the solvents used are not limited to those listed above.

The convex pattern may be formed according to any known approach or according to one or more of the approaches discussed herein. For example, the convex pattern may be formed by coating a resist such as photoresist on the etching target layer 10, and exposing and developing it. The convex pattern may be formed by various non-photolithography processes such as micro-contact printing as well as a photolithography process. One example of the non-photolithography process will be described with reference to FIG. 1 and FIG. 2.

Figure 1:
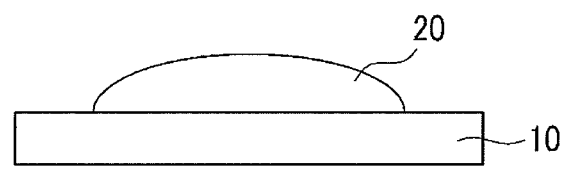
FIGS. 1-9 are cross-sectional views showing a method for forming a minute pattern according to an exemplary embodiment of the present invention.

Referring to FIG. 1, an etching target layer 10 is formed on a substrate (not shown), and a convex pattern material layer 20 is coated thereon. The convex pattern material layer 20 may be composed of the same material as the convex pattern as described above.

Figure 2:
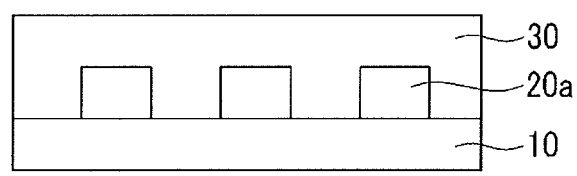

Referring to FIG. 2, a mold 30 having a concave pattern is positioned on the convex pattern material layer 20 and the mold 30 is pressed. The mold 30 may be made of silicon or PDMS (polydimethylsiloxane). The concave pattern of the mold 30 depends on the shape of the convex pattern, and the shape of the surface of the mold 30 is transferred to the convex pattern material layer 20 by stamping according to the pressing of the mold 30.

In a state where the convex pattern is filled to the concave portion of the mold 30, energy such as heat or light such as UV light may be used to harden the convex pattern.

The thickness and width of each convex part 20a of the formed convex pattern or a distance between neighboring convex parts 20a may depend on the width of the minute pattern to be formed and/or the distance between the minute patterns. For example, referring to FIG. 4, the distance D1 between the neighboring convex parts 20a may be in a range from substantially 8 μm to substantially 15 μm, and the width of each convex part 20a may be in a range from substantially 3 μm to substantially 7 μm. The pitch of each convex part 20a may be in a range from substantially 10 μm to substantially 20 μm and the thickness of the convex part 20a may be in a range from substantially 1 μm to substantially 5 μm. However, exemplary embodiments of the present invention should not be understood to be limited to the arrangements provided herein. In a predetermined region, a repetition cycle (e.g., a cycle in which the convex part 20a is represented) of the convex part 20a of the convex pattern may be about ½ of the repetition cycle of the minute pattern to be formed.

Figure 5:
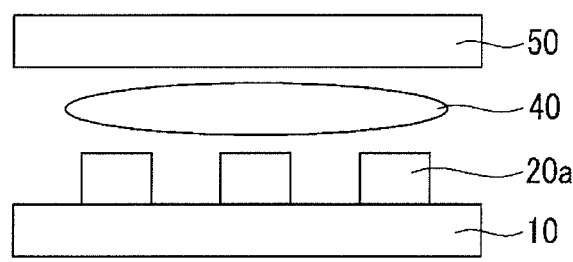

Next, referring to FIG. 5, a resin composition 40 covering the convex pattern is coated. A method such as a spin coating may be used for coating the resin composition 40.

The resin composition 40 may include a polymer and a solvent dissolving the polymer.

The polymer included in the resin composition 40 may include one or more of various polymers that have a lower etch speed than the etch speed of the convex pattern for an etch gas. For example, a polymer included in the resin composition 40 may be PS. The convex pattern may be made of a different material from PS.

The solvent included in the resin composition 40 does not dissolve the convex pattern, does not reacted with the resin composition 40, and may have volatility. This solvent may be an ether such as isopropanol (IPA), a saturated hydrocarbon, a non-saturated hydrocarbon, a ketone, an aromatic hydrocarbon, or a combination thereof. In the resin composition 40, a ratio of these solvents is controlled to control the content of the polymer in the resin composition 40.

Figure 6:
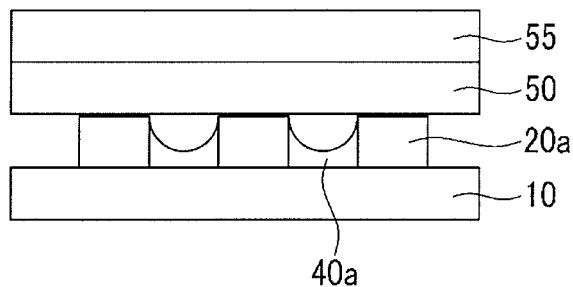
Figure 7:
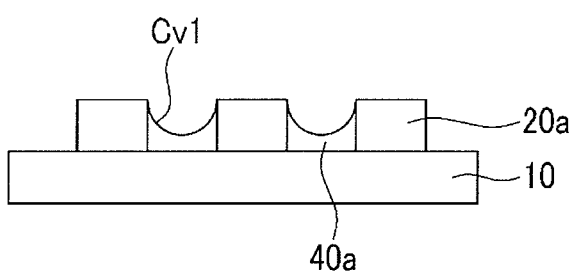

As described above, the resin composition 40 is coated on the convex pattern to form the resin layer 40a. As shown in FIG. 6, a method of applying the pressure to an upper portion of the resin composition 40 may be additionally used. For example, to position most of the resin layer 40a between the neighboring convex parts 20a, as shown in FIG. 6, a mold 50 made of a material such as PDMS is positioned on the coated resin composition 40 and may be pressed by a balance weight 55. The pressing time may be in a range of about several minutes to several tens of minutes. For example, the thickness and mass of the used PDMS may respectively be about 2 mm and 50 g. At least a portion of the solvent of the resin composition 40 may be evaporated under the pressing.

Figure 8:
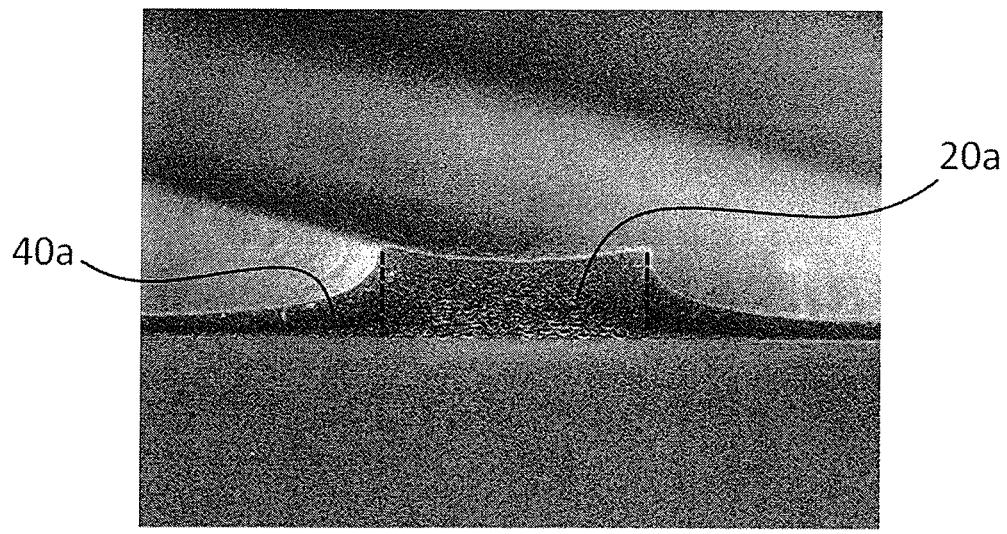
Figure 9:
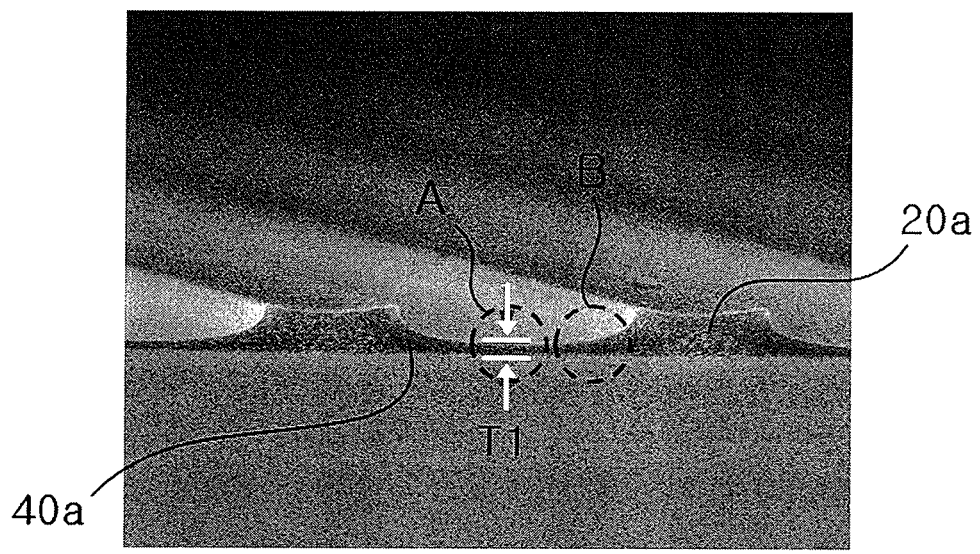
Figure 10:
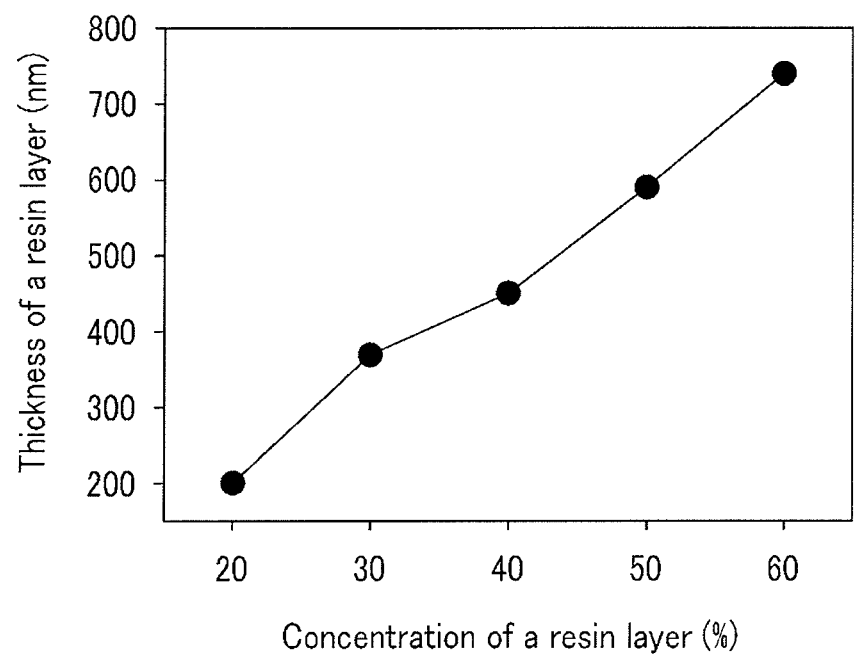
FIG. 10 is a graph of a thickness according to a concentration of a resin layer in one step of a formation method of a minute pattern according to an exemplary embodiment of the present invention.

Referring to FIG. 8 and FIG. 9, some of the formed resin layer 40a is positioned on the convex part 20a, and may be mainly positioned between the neighboring convex parts 20a and may have a profile of a curved surface. The curved surface shape of the surface of the resin layer 40a is referred to as a first curved surface Cv1. Also, referring to FIG. 9, the height of the resin layer 40a of the region B close to the side of the convex part 20a may be greater than the height of the resin layer 40a positioned at the region A between the convex parts 20a. Here, the region A corresponds to the region between two neighboring regions B among the regions between two convex parts 20a. Accordingly, the thickness T1 of the resin layer 40a positioned at the region A between the convex parts 20a is lesser than the thickness of the resin layer 40a of the region B close to the side of the convex part 20a.

The thickness of the resin layer 40a coated on the substrate and the convex pattern may be changed according to a concentration of the resin composition 40.

The graph shown in FIG. 10 illustrates the thickness T1 of the resin layer 40a between the convex parts 20a according to the concentration (%) of the polymer in the resin composition 40.

As may be seen in FIG. 10, the thickness T1 of the resin layer 40a is increased as the concentration of the polymer is increased in the resin composition 40. As the thickness T1 of the resin layer 40a is increased, the thickness of the resin layer 40a of the region B shown in FIG. 9 is increased such that uniformity of the minute pattern to be formed in the following process may be obtained. If the concentration of the polymer is very high, the thickness T1 of the resin layer 40a between the convex part 20a is very thick such that a time for opening the resin layer 40a between the convex part 20a is relatively long in the following process, and thereby a great amount of power may be consumed. Accordingly, the concentration of the resin composition 40 may be appropriately controlled such that the resin layer 40a may not be very thick in the region A between the convex parts 20a while having sufficient thickness in the region B adjacent to the convex part 20a, For example, an appropriate concentration of the resin composition 40 may be in a range from substantially 10% to substantially 50% by volume or mass. In this case, the thickness T1 of the resin layer 40a positioned in the region A between the convex parts 20a may be in a range from substantially 100 nm to substantially 600 nm.

Alternatively, the resin composition 40 might not include the solvent according to the kind of the included resin.

Figure 11:
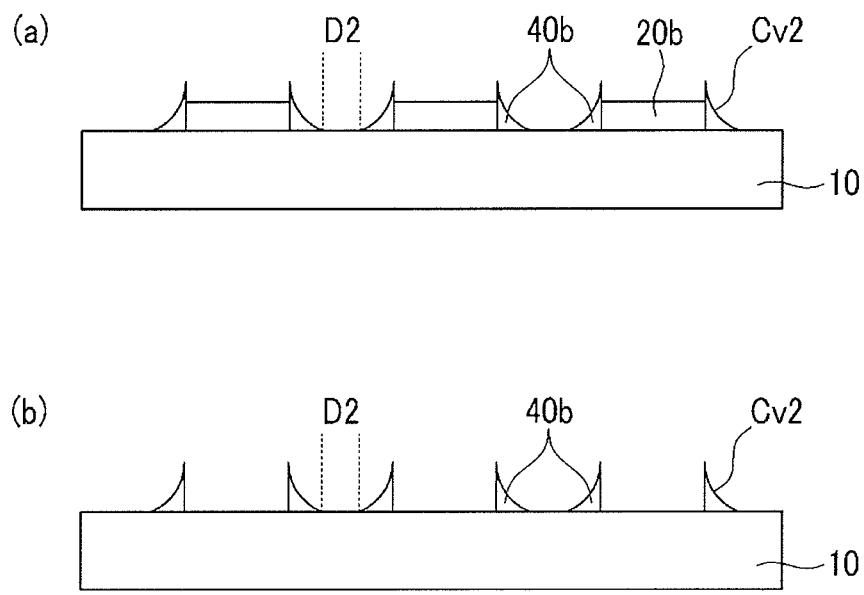
FIG. 11 is a cross-sectional view showing a method for forming a minute pattern according to an exemplary embodiment of the present invention.
Figure 12:
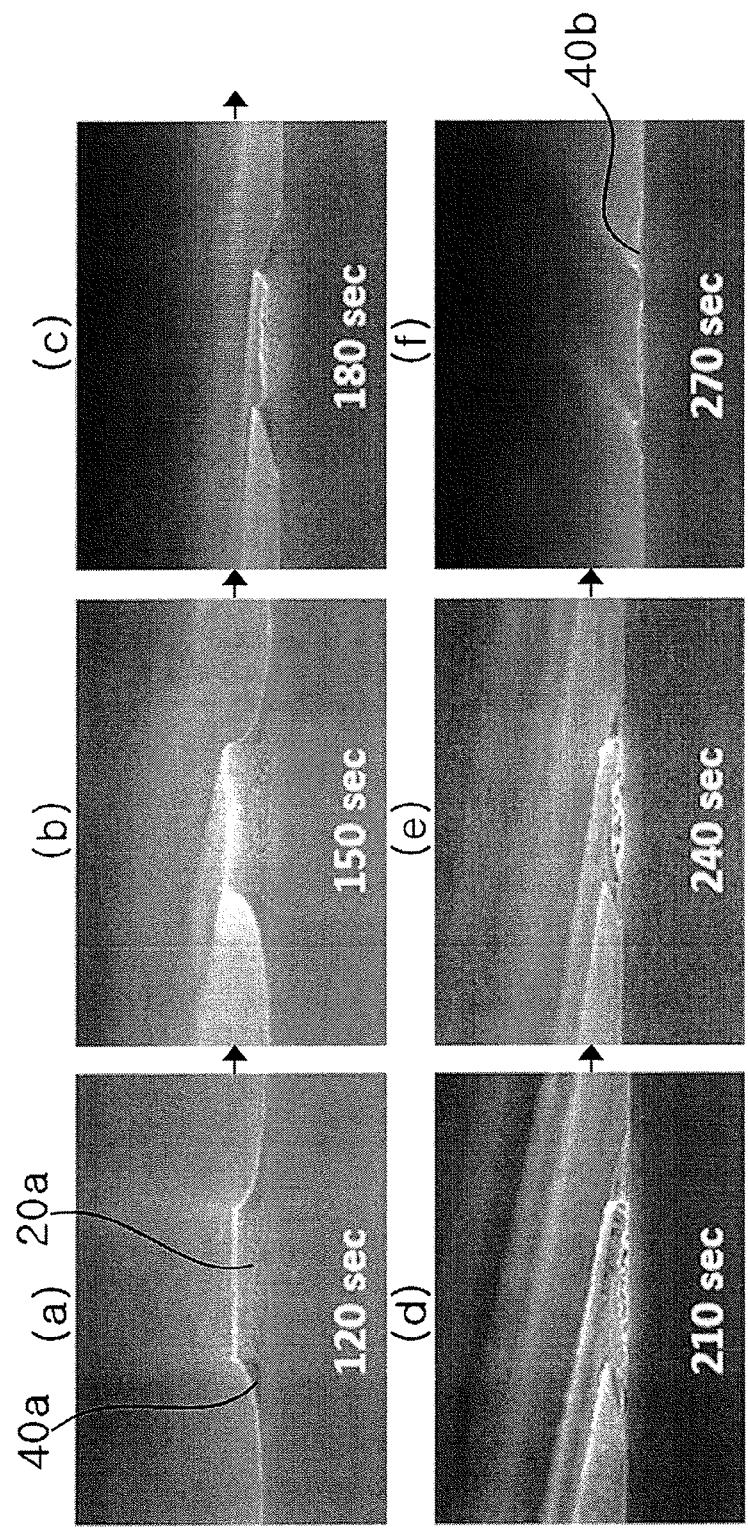
FIG. 12 is a view showing an etch state according to a time of a convex pattern and a resin layer.
Figure 13:
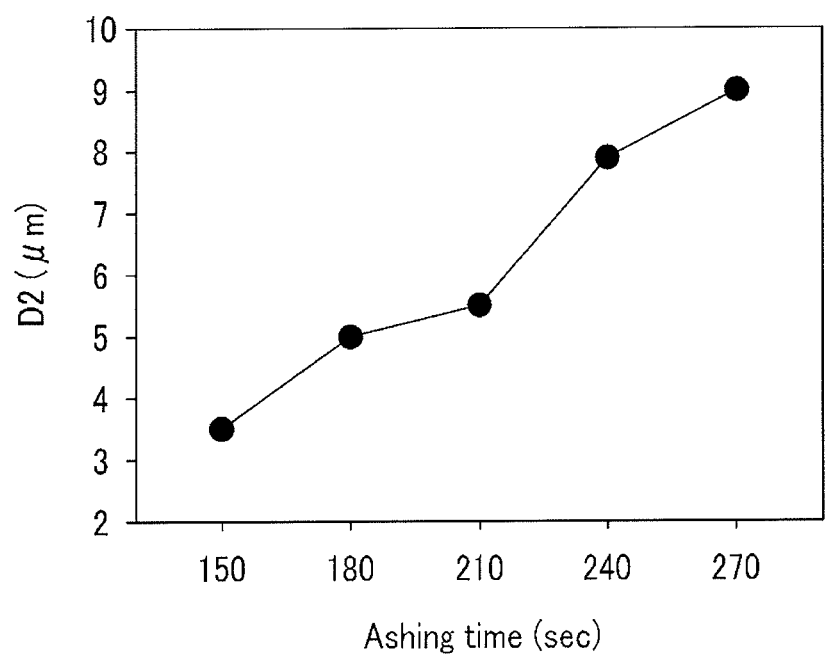
FIG. 13 is a graph showing a change of an interval between the first patterns according to an ashing time in one step of a formation method of a minute pattern according to an exemplary embodiment of the present invention.

Referring to FIG. 11 and FIG. 12, the convex part 20a is removed by using the ashing process, the dry etch process, or the wet etch process.

FIGS. 12(a)-(f) sequentially show shapes of the convex part 20a when it is removed through the ashing process, the dry etch process, or the wet etch process according to a time sequence. Each of the convex parts 20a may be removed and a portion of a convex part 20b may remain. Also, the resin layer 40a positioned in the region A as the region between the convex parts 20a shown in FIG. 9 may be etched together or may be pushed into the region B adjacent to the convex part 20a by the stress. Accordingly, the resin layer 40a may be divided into two portions in the region A between the neighboring convex parts 20a according to the progress of the ashing process or the dry etch process. Therefore, as shown in FIG. 11 and FIG. 12, the patterned resin layer including a plurality of the first resin patterns 40b may be formed.

A pair of the first resin patterns 40b may be positioned at respective sides of the region occupied by each convex part 20a. The curved surface of the first resin pattern 40b may have a second curved surface Cv2 similar to the first curved surface Cv1 of the resin layer 40a. A pair of the first resin patterns 40b positioned at respective sides of the region occupied by each convex part 20a may be substantially symmetrical with respect to each other. The height of the first resin pattern 40b may be changed according to a condition of the height of the convex part 20a and the condition of the ashing process, for example, the height of the convex part may be changed by an amount within the range of about 0.5 μm to about 3 μm. Also, each width of the first resin pattern 40b may be changed according to the thickness of the resin layer 40a and the ashing process condition, for example, the width of the first pattern may be changed by a value within the range of about 1 μm to about 5 μm.

To form the first resin pattern 40b with sufficient thickness, as described above, the thickness of the region B close to the convex part 20a can be greater than the thickness of the region A of the resin layer 40a.

FIG. 13 is a graph illustrating a distance (μm) D2 between the neighboring first resin pattern 40b according to a progressing time (sec) of ashing or etching. The distance D2 between the neighboring first resin patterns 40b that are separated from each other becomes larger, and as shown in FIG. 13, may be gradually increased according to the time of the ashing or the dry etching. The ashing time or the etching time may be greater than 0 seconds and less than 300 seconds. However, the ashing time or the etching time may be appropriately controlled according to the thickness of the first resin pattern 40b.

To form the first resin pattern 40b of the appropriate thickness and to sufficiently remove the convex part 20a, the etch speed of the convex part 20a for the used etch gas may be greater than the etch speed for the resin layer 40a. An example of the etch gas may be a gas such as $O_2$, CO, $CO_2$, a gas such as $N_2$, $NH_3$, or another gas including nitrogen, a gas such as $Cl_2$, HCl, $BCl_3$, or another gas including chlorine, a gas such as HBr and $Br_2$, or another gas including bromine or mixed gases thereof, and a gas such as argon (Ar) and helium (He) may be added.

In the ashing process or the etch process for removing the convex part 20a shown in FIG. 12, an ashing device of model number V15-G from Plasma-Finish GmbH, and the ashing process or the etch process may be performed under process conditions such as a plasma power of 300 W, an etch gas ($O_2$) of substantially 300 sccm, a gas velocity of substantially 150 ml/min, and a process pressure of substantially 100 pa.

In the step shown in FIG. 11 and FIG. 12, the ashing process or the etch process may be performed at room temperature.

After the ashing process or the etch process, the convex part 20a may be removed as shown in FIG. 11(b). However as shown in FIG. 11(a), when a portion of the convex part 20b remains, the remaining convex part 20b may be removed through a separate etch process. At this time, an etchant or an etch gas having a high etch rate of the remaining convex part 20b for the first resin pattern 40b may be used.

Alternatively, the convex part 20a may be removed by the separate etch process after or before forming the patterned resin layer including the first resin pattern 40b by ashing or dry-etching the resin layer 40a.

For example, a method of forming the patterned resin layer including the first resin pattern 40b by ashing or dry-etching the resin layer 40a after firstly removing the convex part 20a will be described with reference to FIG. 14 and FIG. 15.

As shown in FIG. 14(a) and FIG. 15(a), in the stage in which the resin layer 40a is formed on the convex part 20a, the convex part 20a is firstly removed to leave the resin layer 40a, as shown in FIG. 14(b) and FIG. 15(b). At this time, the convex part 20a may be removed by the wet etching. When the convex part 20a is made of PS, an etchant such as toluene may be used. The removal process of the convex part 20a may be performed for about 5-15 seconds.

Next, the resin layer 40a is ashed or dry-etched to form the first resin pattern 40b as shown in FIG. 14(c) and FIG. 15(c). Here, the height of the formed first resin pattern 40b is lower than the height of the resin layer 40a shown in FIG. 14(b) and FIG. 15(b). The characteristic of the first resin pattern 40b and the ashing or the dry etch condition for the resin layer 40a are also the same as in the above description such that the detailed description is omitted.

Figure 14:
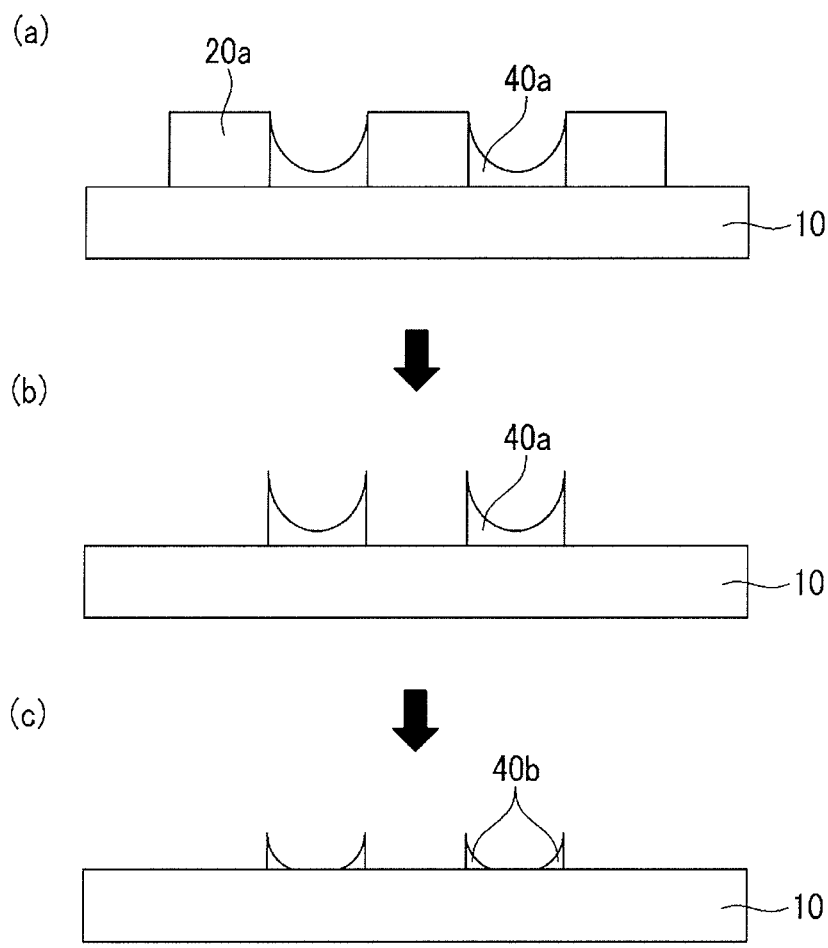
FIGS. 14-20 are cross-sectional views showing a method for forming a minute pattern according to an exemplary embodiment of the present invention.
Figure 15:
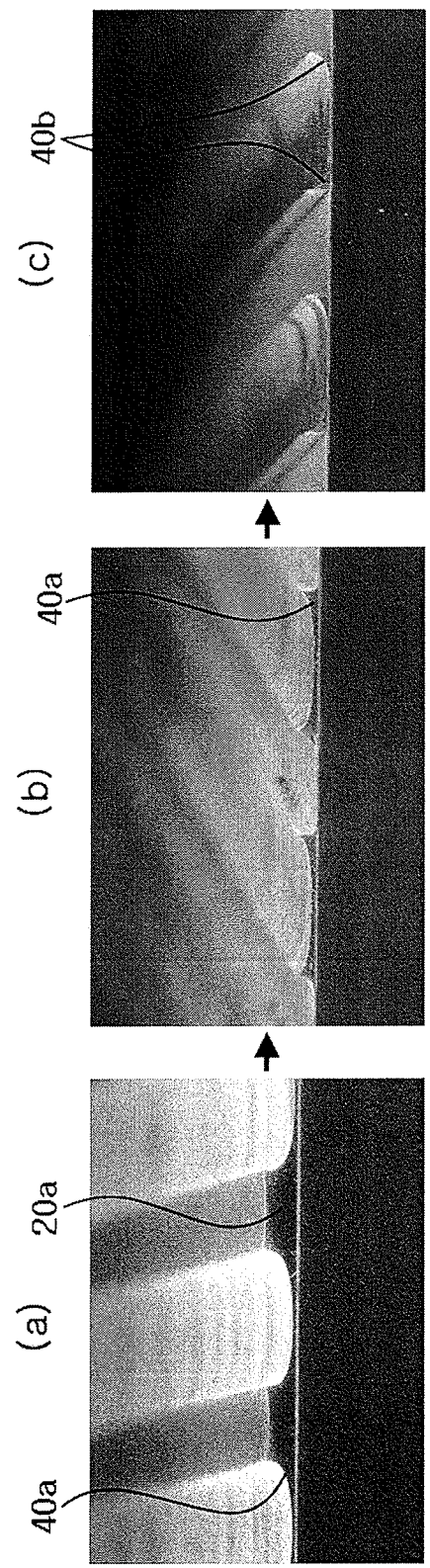

As shown in FIG. 14 and FIG. 15, after the first resin pattern 40b is firstly formed, the convex part 20a may be removed.

Figure 16:
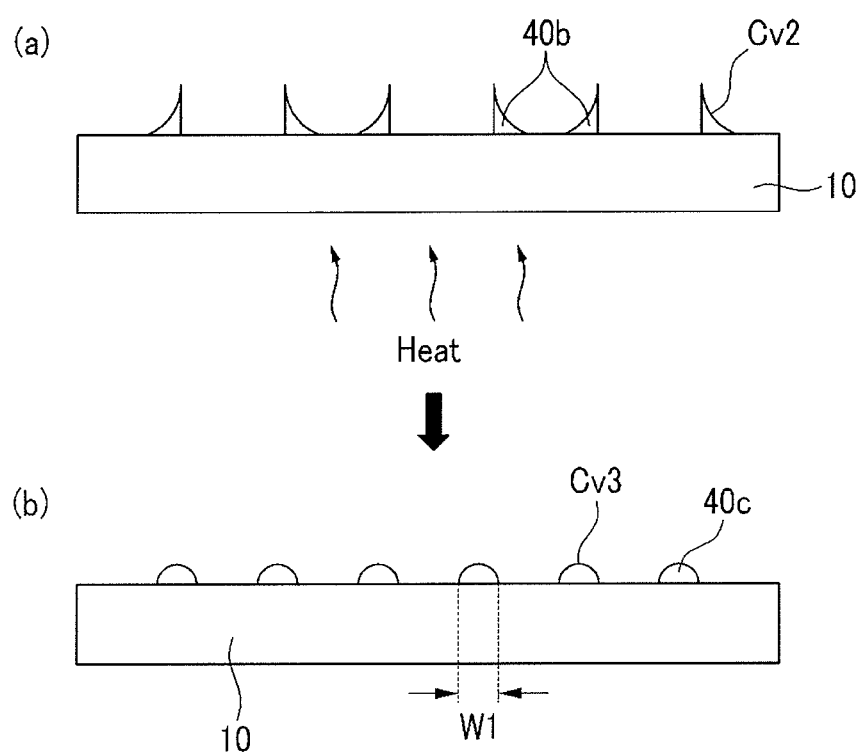
Figure 17:
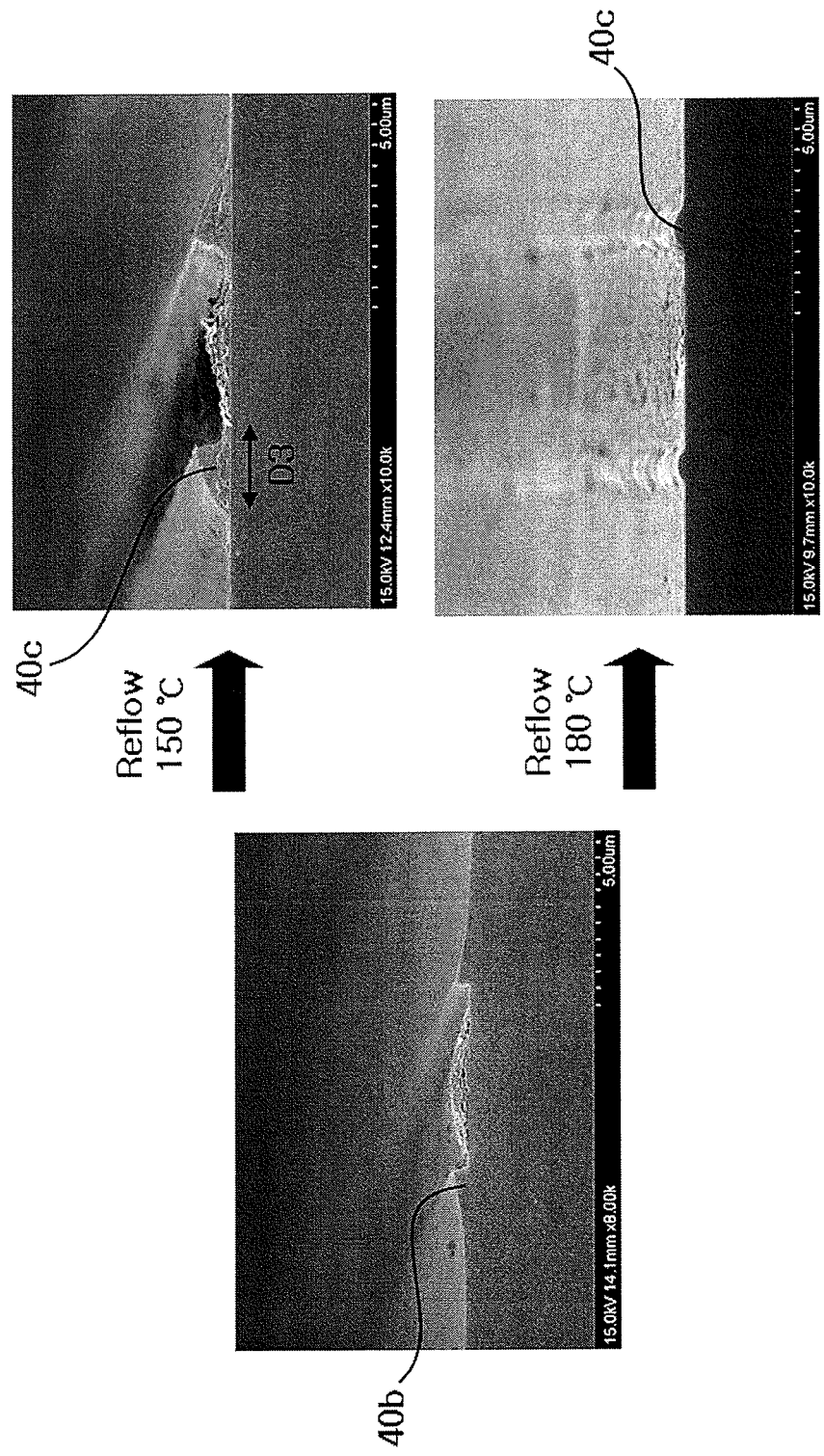

Next, referring to FIG. 16 and FIG. 17, the first resin pattern 40b is processed to form a plurality of second resin patterns 40c having a third curved surface Cv3 that is different from the second curved surface Cv2. As an example of this process, heat may be applied to the entire substrate for baking and light may be radiated upon the first resin pattern 40b for reflowing. An exemplarily temperature for the reflow may be in a range from substantially 150° C. to substantially 180° C., and a reflow time may be more than 0 seconds and equal to or less than substantially 10 minutes. However, the process condition is not limited thereto and may be appropriately controlled according to the condition.

Figure 18:
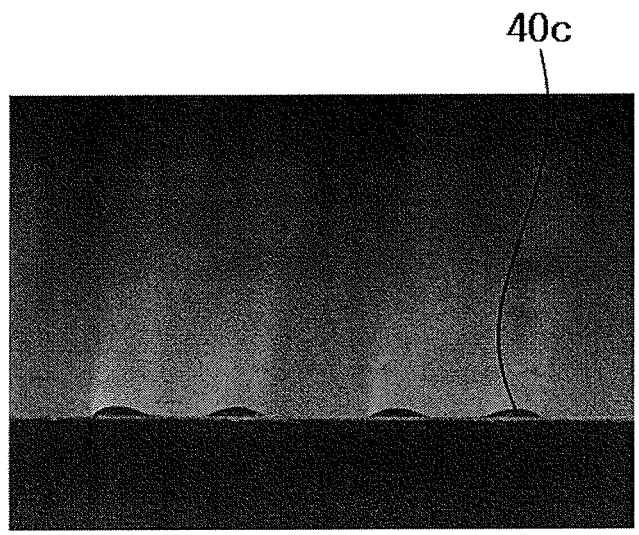

FIG. 18 is a view showing a shape of the second resin pattern 40c formed by processing the first resin pattern 40b at a temperature about 180° C. for about 2-5 minutes.

Referring to FIG. 16, FIG. 17, and FIG. 18, the surface of the first resin pattern 40b before the processing has the curved surface that is close to a straight line at the highest portion; however the surface of the second resin pattern 40c may have the third curved surface Cv3 that is convex upward after the processing. Also, the inclination of the portion close to the convex part 20a of one first resin pattern 40b is steeper than the inclination of the opposite side thereby forming right and left asymmetry; however the second resin pattern 40c after the processing such as the reflowing may have a cross-sectional shape of right and left symmetry. Use of a high reflowing temperature may make the second resin pattern 40c more symmetrical. The width W1 of each second resin pattern 40c may depend on the width and the thickness of the first resin pattern 40b and the processing time, and may be made to be larger than the width of the first resin pattern 40b by the reflowing. For example, the width W1 of the second resin pattern 40c may be 2-4 μm.

Figure 19:
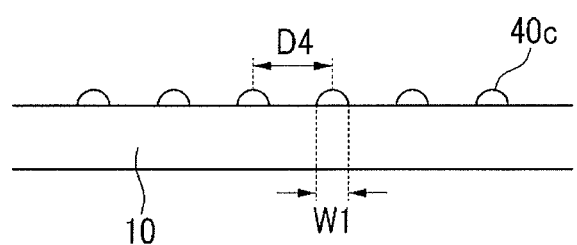
Figure 20:
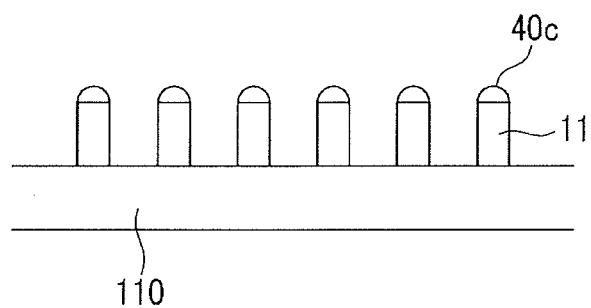

FIG. 19 is a view showing the second resin pattern 40c having the substantially right and left symmetrical shape after processing the first resin pattern 40b through the reflowing. As shown in FIG. 20, the above-described formed second resin pattern 40c as the minute pattern mask may be used as an etch mask for etching the underlying etching target layer 10. Accordingly, the etching target layer 10 is etched by using the second resin pattern 40c as the etch mask to form a minute pattern 11 positioned on the substrate 110. The width of the formed minute pattern 11 is changed according to the width w1 of the second resin pattern 40c, and the pitch of the minute pattern 11 may also depend on the pitch D4 of the second resin pattern 40c.

As described above, the formation process of the resin layer 40a and the first resin pattern 40b to form the minute pattern mask need not include removing the solvent inside the resin composition and heating for hardening. The first resin pattern 40b is processed through the reflowing in the final process after the removal of the convex pattern such that the minute pattern mask having the third curved surface Cv3 of the substantially symmetrical shape may be manufactured. When using the minute pattern mask having the symmetrical shape as the etch mask to form the minute pattern 11, the uniformity and the accuracy of the minute pattern 11 may be further increased.

As above described above, the pitch of the minute pattern formed according to an exemplary embodiment of the present invention may be about half of the pitch of the convex pattern such that the minute pattern may be formed using the light exposer without an additional apparatus and additional cost, even though the width or the interval of the convex pattern is disposed inside the range of the resolution of the light exposer. Accordingly, the minute pattern having a width of less than 3 μm may also be formed.

The formation method of the minute pattern according to exemplary embodiments described above with respect to FIG. 1 to FIG. 20 may be applied to a manufacturing method of various display devices. This will be described with reference to FIG. 21 and FIG. 22.

Figure 21:
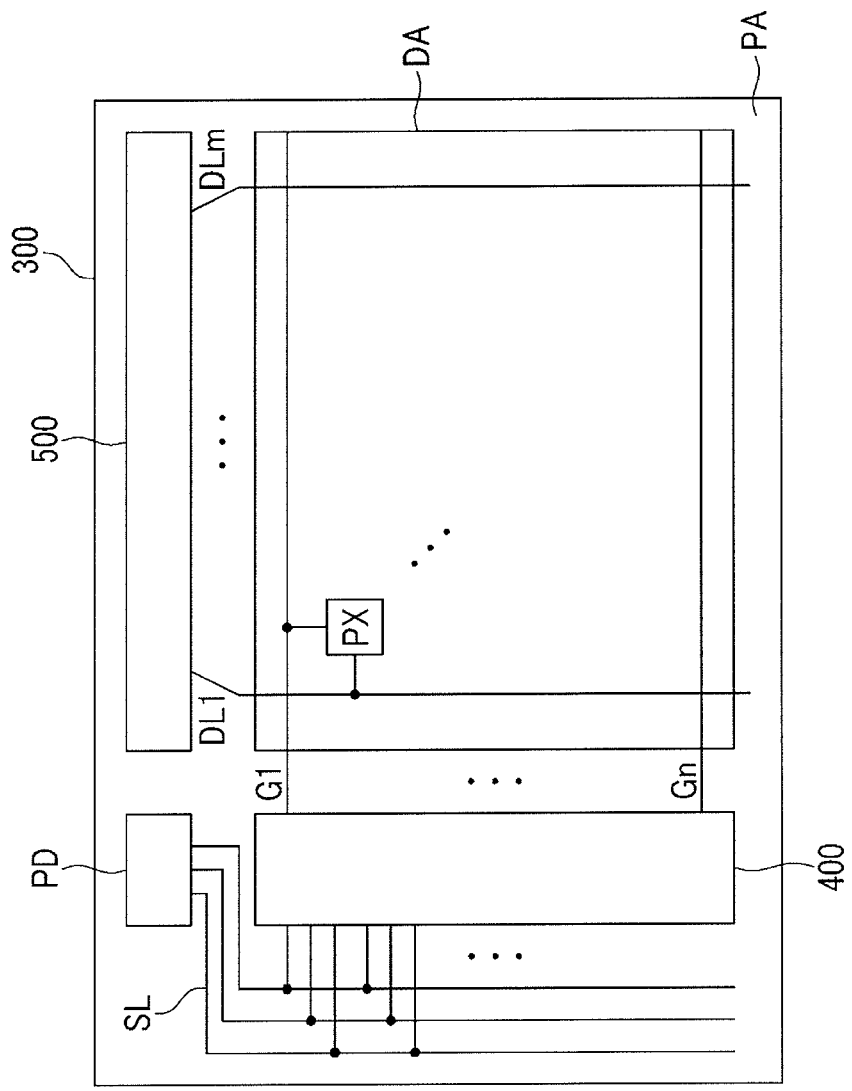
FIG. 21 is a top plan view of a display panel including a minute pattern manufactured by a minute pattern formation method according to an exemplary embodiment of the present invention.
Figure 22:
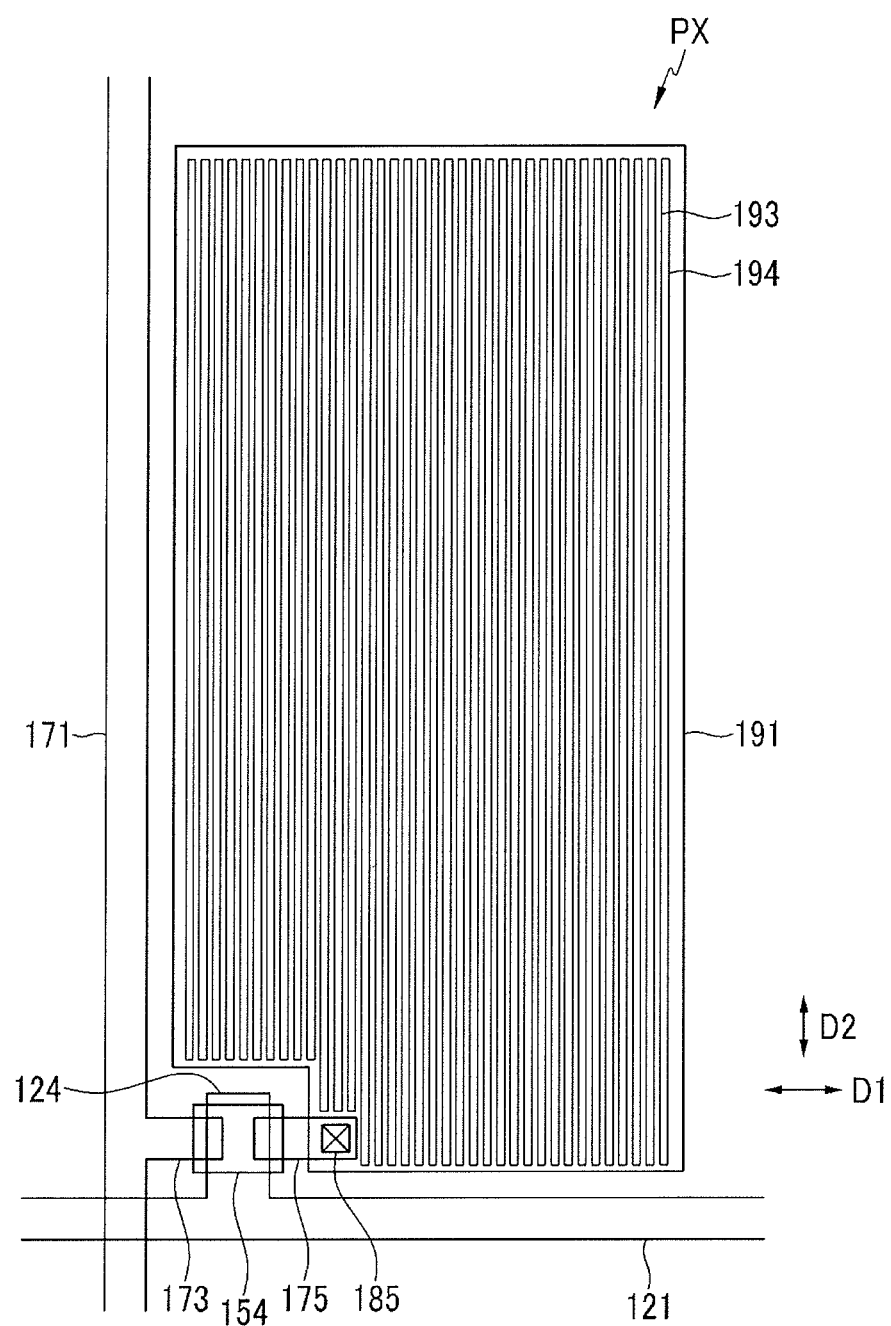
FIG. 22 is a top plan view of one pixel of a display device including a minute pattern manufactured by a minute pattern formation method according to an exemplary embodiment of the present invention.

FIG. 21 is a top plan view of a display panel including a minute pattern manufactured by a minute pattern formation method according to an exemplary embodiment of the present invention. FIG. 22 is a top plan view of one pixel of a display device including a minute pattern manufactured by a minute pattern formation method according to an exemplary embodiment of the present invention.

Referring to FIG. 21, a display device according to an exemplary embodiment of the present invention includes a display panel 300 having a display area DA and a peripheral area PA. The display panel 300 includes a gate driver 400, a data driver 500, and a plurality of pixels PX. The plurality of pixels PX may be positioned in the display area DA. The gate driver 400 and the data driver 500 may be positioned in the peripheral area PA. The gate driver 400 is connected to a plurality of gate lines G1-Gn thereby transmitting a gate signal to the plurality of pixels PX. The data driver 500 is connected to a plurality of data lines DL1-DLm thereby transmitting a data voltage to the plurality of pixels PX. Drivers such as the gate driver 400 and the data driver 500 may include an electric circuit and elements such as a plurality of thin film transistors and capacitors, and signal wires. Each of the plurality of pixels PX is connected to the corresponding gate lines G1-Gn and the corresponding data lines DL1-DLm through the thin film transistor thereby receiving the data voltage according to the gate signal. Also, the peripheral area PA further includes a plurality of wires SL transmitting the driving signal to the gate driver 400. The wires SL may receive the driving signal through a signal pad portion PD from an external source.

A plurality of signal circuits including various wires SL, the gate lines G1-Gn, the data lines DL1-DLm, the gate driver 400, or the data driver 500 of the display device may be formed by using the above-described minute pattern formation method.

Referring to FIG. 22, one pixel of the display device according to an exemplary embodiment of the present invention includes a gate line 121 including a gate electrode 124 positioned on a substrate, a semiconductor 154, a data line 171 including a source electrode 173, a drain electrode 175, and a pixel electrode 191 connected to the drain electrode 175 through a contact hole 185. The pixel electrode 191 according to an exemplary embodiment of the present invention includes a plurality of minute patterns 193 extending in a predetermined direction and substantially parallel to each other. An opening between adjacent minute patterns 193 is referred to as a minute slit 194. The pitch of the minute pattern 193 may be less than 200 nm, and light passing through the pixel electrode 191 may be polarized. For example, the minute pattern 193 and the minute slit 194 of the pixel electrode 191 may reflect the light with a polarization that is parallel to the extending direction of the minute pattern 193 or the minute slit 194, and may transmit the light with a polarization that is perpendicular to the extending direction of the minute pattern 193 or the minute slit 194. Accordingly, the pixel electrode 191 including the minute pattern 193 according to an exemplary embodiment of the present invention has a polarization function and the direction perpendicular to the extending direction of the minute pattern 193 may be a transmissive axis of the polarization.

As described above, the minute pattern 193 of the pixel electrode 191 can have a width and interval transcending the resolution of the light exposer to have the appropriate polarization function according to the wavelength of the light, and it may be manufactured by using the above-described minute pattern formation method.

The invention is not limited to the disclosed embodiments, but, on the contrary, is intended to cover various modifications and equivalent arrangements.

What is claimed is:

1. A method for forming a pattern comprising:
   forming an etching target layer on a substrate;
   forming a convex pattern including a plurality of convex parts on the etching target layer;
   coating a resin composition on the convex pattern to form a resin layer disposed between two neighboring convex parts of the plurality of convex parts;
   ashing or etching the resin layer to divide the resin layer into two separate parts thereby forming a plurality of first resin patterns;
   reflowing the plurality of first resin patterns to form a plurality of second resin patterns; and
   etching the etching target layer using the plurality of second resin patterns as an etch mask forming a pattern.

2. The method of claim 1, wherein the forming of the plurality of second resin patterns includes applying heat to the plurality of first resin patterns to reflow the plurality of first resin patterns.

3. A method for forming a pattern comprising:
   forming an etching target layer on a substrate;
   forming a convex pattern including a plurality of convex parts on the etching target layer;
   coating a resin composition on the convex pattern forming a resin layer including a first region neighboring a convex part of the plurality of convex parts and a second region between two neighboring convex parts of the plurality of convex parts;
   ashing or etching the resin layer forming a plurality of first resin patterns;
   reflowing the plurality of first resin patterns to form a plurality of second resin patterns; and
   etching the etching target layer using the plurality of second resin patterns as an etch mask thereby forming a pattern in the etching target layer,
   wherein the forming of the plurality of second resin patterns includes applying heat to the plurality of first resin patterns to reflow the plurality of first resin patterns, and
   wherein a surface of a first resin pattern of the plurality of first resin patterns has a first curved surface, and a surface of a second resin pattern of the plurality of second resin patterns has a second curved surface of a different shape than that of the first curved surface.

4. The method of claim 3, wherein: the shape of the second resin pattern has a symmetrical cross-section.

5. The method of claim 4, wherein the applying of the heat to the plurality of the first resin patterns for reflowing is performed at a temperature in a range from substantially 150° C. to substantially 180° C.

6. The method of claim 1, wherein the forming of the plurality of first resin patterns includes ashing or dry-etching using a gas.

7. The method of claim 6, wherein the forming of the plurality of first resin patterns includes removing the convex parts.

8. The method of claim 7, wherein in the forming of the plurality of first resin patterns, the resin layer and the convex parts are etched through a same etch process, and an etch speed for the convex part is greater than an etch speed for the resin layer.

9. The method of claim 7, wherein in the forming of the plurality of first resin patterns, the resin layer is ashed or etched after removing the convex parts though wet etching.

10. The method of claim 1, wherein a thickness of the first region of the resin layer is greater than a thickness of the second region.

11. The method of claim 10, wherein a thickness of the second region is in a range from substantially 100 nm to substantially 600 nm.

12. The method of claim 11, wherein the resin composition includes a polymer and a solvent.

13. The method of claim 12, wherein the solvent includes isopropanol (IPA).

14. The method of claim 12, wherein a concentration of the resin composition is in a range from substantially 10% to substantially 50% by volume or mass.

15. The method of claim 12, wherein the forming of the resin layer includes coating the resin composition on the convex pattern and then applying pressure to the resin composition.

16. The method of claim 1, wherein the forming of the convex pattern includes using a micro-contact printing method.

17. A method for forming a pattern mask comprising:
    forming an etching target layer on a substrate;
    forming a convex pattern including a plurality of convex parts on the etching target layer;
    coating a resin composition on the convex pattern to form a resin layer disposed between two neighboring convex parts of the plurality of convex parts;
    ashing or etching the resin layer to divide the resin layer into two separate parts thereby forming a plurality of first resin patterns; and
    reflowing the plurality of first resin patterns forming a pattern mask including a plurality of second resin patterns.

18. The method of claim 17, wherein the forming of the plurality of the second resin patterns includes heating the plurality of first resin patterns to reflow the plurality of first resin patterns.

19. The method of claim 18, wherein a surface of a first resin pattern of the plurality of first resin patterns has a first curved surface, and a surface of a second resin pattern of the plurality of second resin patterns has a second curved surface of a different shape than that of the first curved surface.

20. The method of claim 17, wherein the second resin pattern has a symmetrical cross-sectional shape.

21. The method of claim 17, wherein the forming of the plurality of first resin patterns includes ashing or dry etching using a gas.

* * * * *